United States Patent [19]
Callahan

[11] Patent Number: 5,930,180
[45] Date of Patent: Jul. 27, 1999

[54] ROM BIT SENSING

[75] Inventor: John M. Callahan, San Ramon, Calif.

[73] Assignee: Enable Semiconductor, Inc., Milpitas, Calif.

[21] Appl. No.: 08/886,616

[22] Filed: Jul. 1, 1997

[51] Int. Cl.⁶ .................................................. G11C 16/04
[52] U.S. Cl. .............. 365/189.09; 365/207; 365/230.06; 365/203
[58] Field of Search .................................. 365/204, 205, 365/185.2, 189.09, 207, 230.06, 203, 210

[56] References Cited

U.S. PATENT DOCUMENTS

| | | | |
|---|---|---|---|
| 4,541,077 | 9/1985 | Rapp | 365/210 |
| 4,651,302 | 3/1987 | Kimmel et al. | 365/104 |
| 5,103,116 | 4/1992 | Sivilotti et al. | 307/272.2 |
| 5,297,093 | 3/1994 | Coffman | 365/208 |
| 5,619,449 | 4/1997 | McIntyre | 365/185.21 |
| 5,703,820 | 12/1997 | Kohno | 365/204 |

Primary Examiner—David Nelms
Assistant Examiner—Thong Le
Attorney, Agent, or Firm—Patrick T. King

[57] ABSTRACT

A read only memory including: a plurality of memory cells arranged in x rows and y columns in an array; x wordlines each connected to y memory cells in a respective row; y bitlines each associated with x memory cells in a respective column; m reference bitlines each corresponding to n bitlines, each of the reference bitlines having x reference cells each connected to a respective wordline; and m sense amplifiers each having a first input terminal connected to a respective n bitlines and having a second input terminal connected to one of the reference bitlines, and each being responsive to a difference between a signal on one of the n bitlines and a signal on one of the reference bitlines.

20 Claims, 4 Drawing Sheets

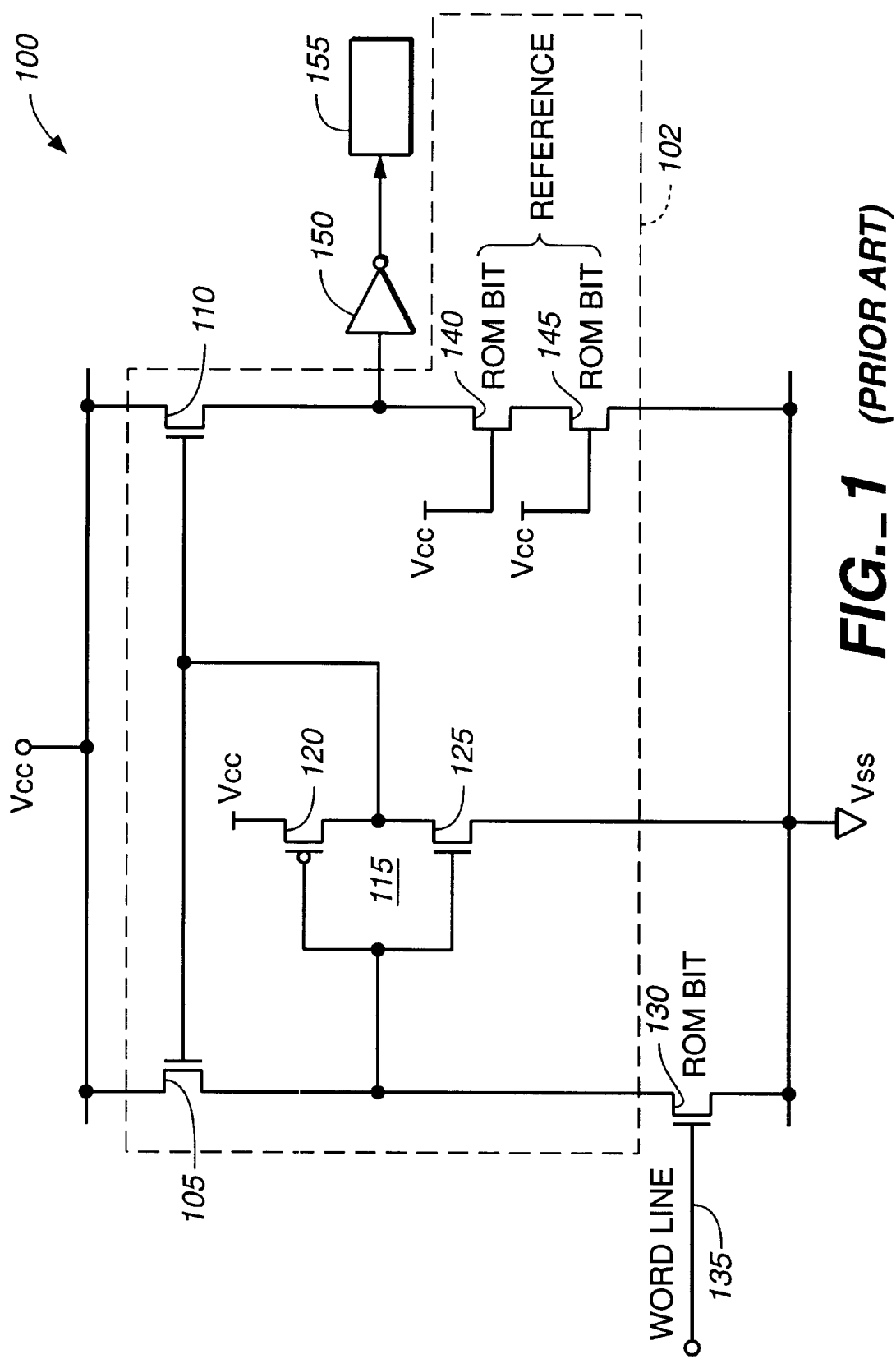
FIG._1 *(PRIOR ART)*

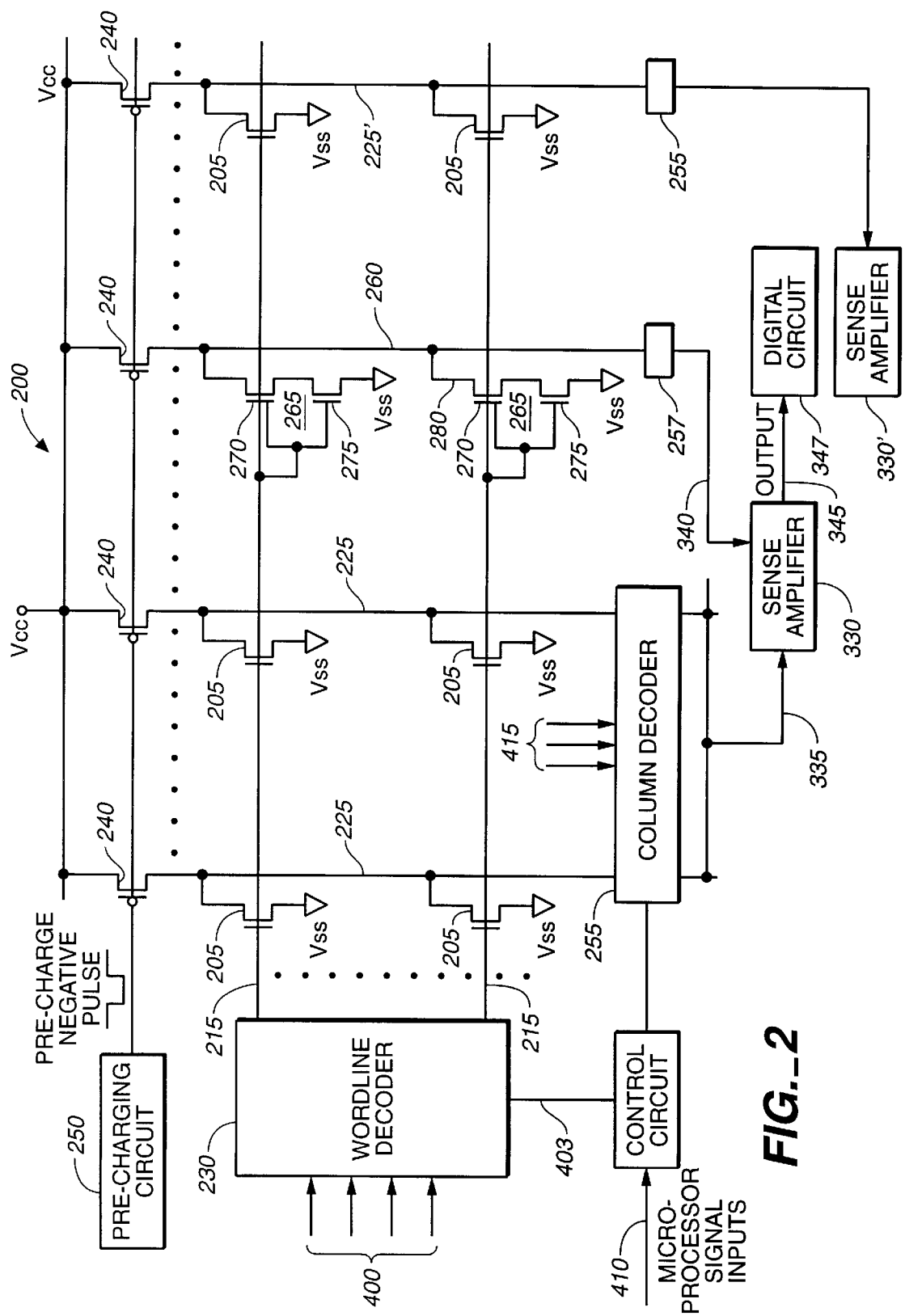
FIG._2

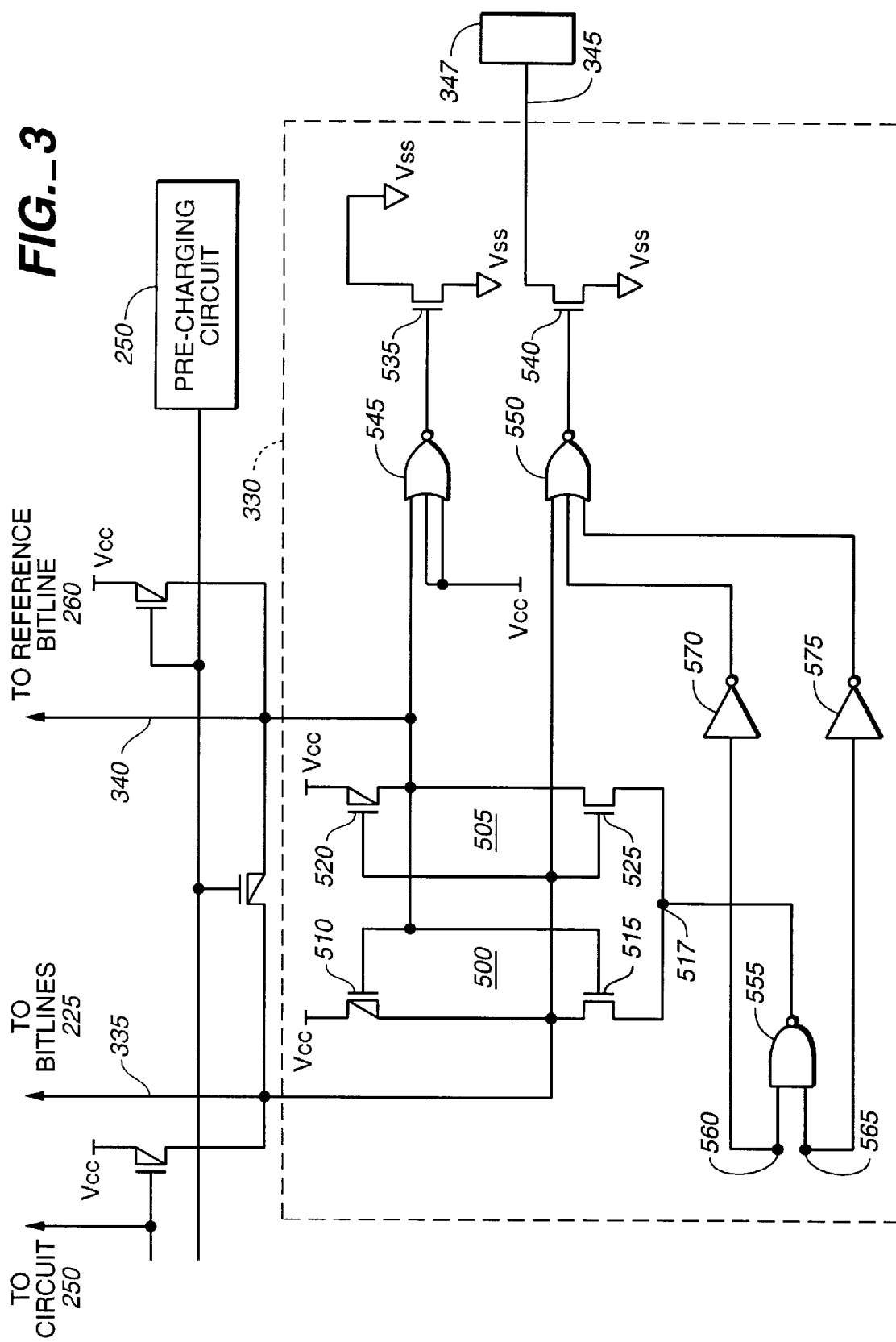

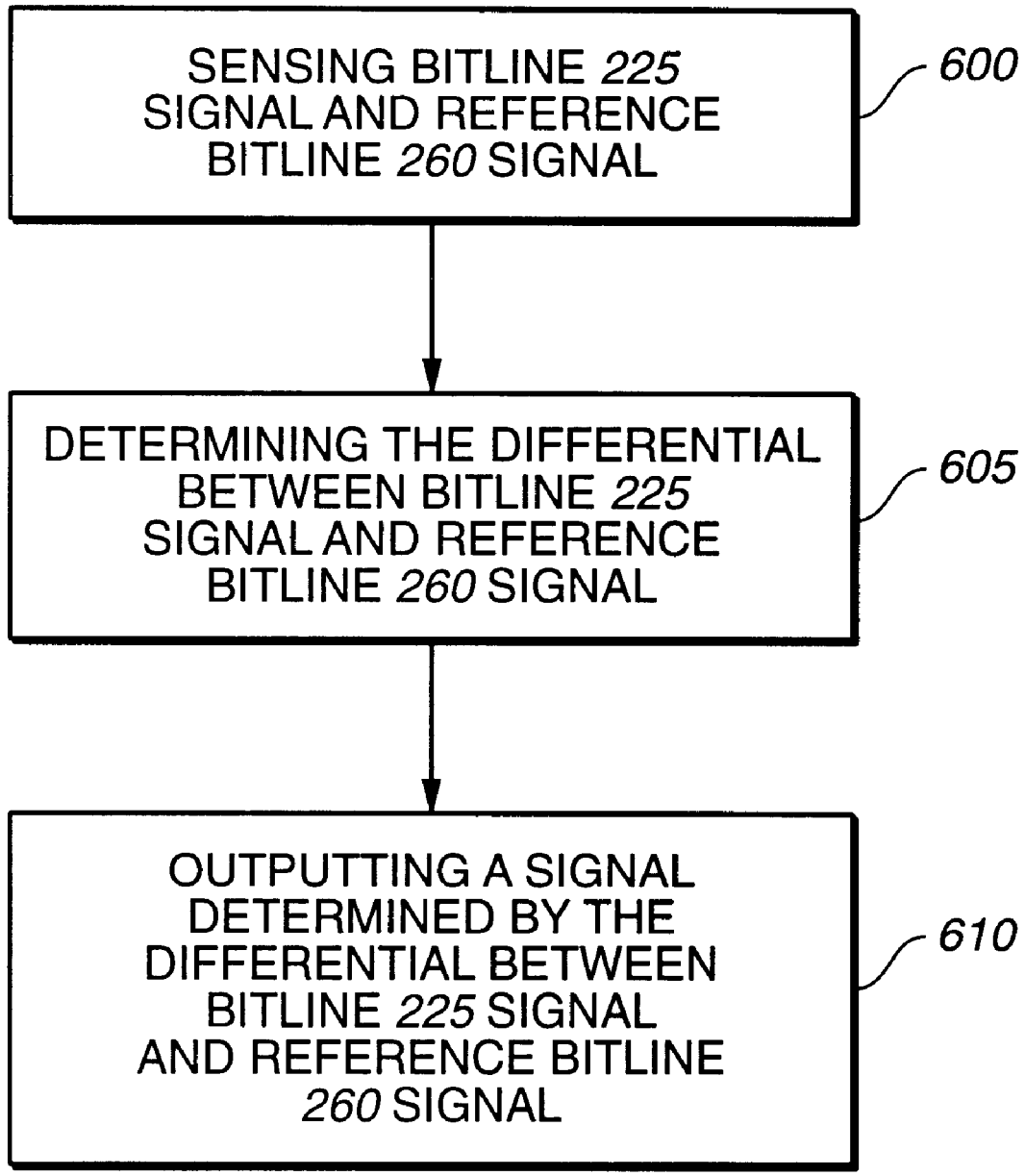
FIG._4

ROM BIT SENSING

This invention is related to an invention by the same inventor, assigned to the same Assignee and described in a patent application entitled "DIGITAL CIRCUIT FOR CONSERVING STATIC CURRENT IN AN ELECTRONIC DEVICE," which is hereby incorporated by reference in its entirety.

BACKGROUND OF THE INVENTION

1. Field of the Invention

The present invention relates generally to read-only memories (ROMs) and more specifically to a circuit for sensing bits in ROMs.

2. Background Art

Electronic read only memory (ROM) cells are usually organized in a rectangular (x-y) array, and the state of a particular cell is determined by using row decoders to activate a particular wordline (typically in the x direction) and by using column decoders to detect the bitline signal response on the bitlines (typically in the y direction). FIG. 1 shows a memory system 100 including a conventional sense amplifier or current mirror circuit 102 for sensing binary bits ("1" or "0") in a ROM array. Sense amplifier 102 utilizes a conventional single-ended sensing scheme. N-channel current mirror transistors 105 and 110 have drains connected to a first supply voltage potential "Vcc" which is typically at a positive value, and have gates connected to each other. Transistor 110, which is the load transistor, mirrors the current through transistor 105, which is the load mirror transistor. Transistors 105 and 110 may ratio current such that the current through transistor 110 is, for example, twice the current through transistor 105. A predetermined ratio may be realized by the conventional practice of forming the respective source-drain paths of transistors 105 and 110 with proper relative dimensions.

An inverter 115 has an input terminal connected to the source of transistor 105 and has an output terminal connected to the gates of transistors 105 and 110. Inverter 115 includes p-channel transistor 120 and n-channel transistor 125. Transistors 120 and 125 have their gates connected together and to the source of n-channel transistor 105, and have their drains connected together and to the output of inverter 115. P-channel transistor 120 has its source connected to Vcc, while n-channel transistor 125 has its source connected to a second supply voltage potential Vss which is typically at ground.

ROM bit cell 130 is typically an n-channel transistor with its gate connected to a wordline 135, its drain connected to the source of n-channel transistor 105 and its source connected to Vss. Reference cells 140 and 145 (typically n-channel transistors) have their gates connected to Vcc. The source of reference cell 140 is connected to the drain of reference cell 145. The source of reference cell 145 is connected to Vss, while the drain of reference cell 140 is connected to the source of n-channel transistor 110 and to the input terminal of amplifier 150. Amplifier 150 has an output terminal connected to digital circuitry 155, typically bus drivers, a data bus or output registers. Sense amplifier 102 can sense the state of a data bit stored in ROM bit cell 130 and accordingly output a digital signal representing the value of the stored data bit.

Sense amplifier 102 has the disadvantage of losing speed or functioning capability when the Vcc voltage level falls to two transistor threshold voltage levels or $2 V_T$. Thus, when Vcc falls to a low voltage level, e.g., 1.2 volts, sense amplifier 102 is unable to sense ROM bits.

Additional bitline sensing circuits in a memory array are disclosed in U.S. Pat. Nos. 4,541,077, 5,297,093 and 5,619,449, which are fully incorporated herein by reference. Current mirror circuits are further discussed in Horowitz, Paul and Hill, Winfield, *The Art Of Electronics* (2nd ed.), Cambridge University Press, New York, N.Y. (1996), which is fully incorporated herein by reference.

There remains a need for a circuit and method for sensing ROM bits at low supply voltage levels.

SUMMARY OF THE INVENTION

The present invention provides a read only memory including: a plurality of memory cells arranged in an array having x number of rows and y number of columns; x number of wordlines in respective rows each connected to the same y number of memory cells; y number of bitlines in respective columns each associated with x number of memory cells; m number of reference bitlines corresponding for every n number of bitlines, each of the m reference bitlines having x number of reference cells, each of the x reference cells connected to one of the x number of wordlines; and a sense amplifier circuit having a first input terminal connected to the n bitlines and having a second input terminal connected to one of the m reference bitlines. The sense amplifier circuit is configured to sense the difference between a signal on one of the n bitlines and a signal on one of the reference bitlines.

The present invention further provides a method for sensing ROM bits at low voltage levels, including the steps of: (a) sensing a bitline signal and a reference bitline signal; (b) determining the differential between the bitline signal and the reference bitline signal; and (c) outputting a signal determined by the differential between the bitline signal and the reference bitline signal.

The invention can function when the supply voltage is at a low level, Thus, the invention makes possible an advantage of ROM bit sensing at low voltage levels.

BRIEF DESCRIPTION OF THE DRAWINGS

FIG. 1 is a schematic diagram of a prior art current mirror circuit for sensing ROM bits;

FIG. 2 shows a NOR-type ROM cell array 200 incorporating the present invention;

FIG. 3 shows the details of the sense amplifier of FIG. 2; and

FIG. 4 is a flowchart illustrating steps in a method of operation according to the invention.

DETAILED DESCRIPTION OF THE INVENTION

FIG. 2 shows a NOR-type ROM cell array 200 incorporating the present invention. Each ROM bit cell 205 is an n-type field effect transistor configured (by being disabled or not) for storing a binary bit ("1" or "0") of data. Each of the gates in a row of cells 205 is connected to a common wordline 215, and the wordlines 215 are connected to a wordline decoder 230. Each of the drains in a column of cells 205 is connected to a common pre-charged bitline 225. The cell 205 sources are each connected to a reference voltage potential Vss which is typically at ground.

A p-channel transistor 240 has a source connected to a positive voltage potential Vcc, has a drain connected to a pre-charged bitline 225 and has a gate configured to receive a pre-charge negative pulse signal from a pre-charging circuit 250.

According to the invention, a pre-charged reference bitline 260 is placed, for example, after every thirty-two bitlines 225. However, a reference bitline 260 may be placed after other predetermined numbers of bitlines 225 as determined by design requirements. Each reference bitline 260 includes a p-channel transistor 240 and, for each row, a respective reference cell 265 driven by a wordline 215.

Each reference cell 265 includes a first n-channel transistor 270 and a second n-channel transistor 275. Transistor 270 has its drain connected to its reference bitline 260 and has its source connected to the drain of transistor 275. The source of transistor 275 is connected to Vss. The gates of transistors 270 and 275 are connected together and to a wordline 215.

The transistors shown in FIG. 2 (e.g., transistors 205, 240, 270 and 275) each have a channel length of 0.35 microns, but this may vary according to design requirements.

According to the invention, NOR-type ROM cell array 200 includes a plurality of sense amplifiers 330 for sensing the signals along bitlines 225 and reference bitlines 260. A sense amplifier 330 has a first input line 335 connected to, for example, thirty-two bitlines 225 and has a second input line 340 connected to a reference bitline 260. Sense amplifier 330 has an output terminal also connected to line 345 for driving signals to a subsequent digital circuit 347 such as bus drivers, data buses or output registers.

FIG. 2 illustrates only a portion of NOR-type ROM cell array 200. Additional wordlines 215 and bitlines 225' are included in array 200 and are represented by ellipses shown in FIG. 2. Additional reference bitlines 260 and sense amplifiers 330' are included for additional bitlines 225', while additional reference cells 265 are included for additional wordlines 215. ROM cell arrays are discussed further in Price, Betty, *Semiconductor Memories*, John Wiley & Sons, New York, N.Y. (2nd ed. 1991) and Horowitz, Paul and Hill, Winfield, *The Art Of Electronics* (2nd ed.), supra, which are fully incorporated herein by reference.

The invention normally operates at a Vcc voltage range between about 1.8 volts to about 3.3 volts. However, sense amplifier 330 can sense small voltage differences between a bitline 225 and a reference bitline 260. Thus, the invention can also function at a low Vcc voltage level, e.g., at about 1.2 volts.

In the read mode in response to wordline address signals on lines 400 and to a read signal on line 403 from a control circuit 405 configured to receive via line 410 microprocessor signal inputs, wordline decoder 230 applies a preselected positive voltage (for example, about 1.2 volts to about 3.6 volts) to a selected wordline 215 and thus to the gate of selected ROM bit cell 205. In response to column address signals on lines 415, column decoder 255 selects the appropriate column. Since the selected p-channel transistor 240 is pulsed on, it pulls a bitline 225 to the voltage level of Vcc. Similarly, a reference (or "dummy") column decoder 257 selects the appropriate reference bitline 260 corresponding to the selected column. Reference column decoder 257 provides the select impedance to a reference bitline 260, in the same manner as column decoder 255 provides the select impedance to a bitline 225 (or 225').

After wordline decoder 230 selects a wordline 215, if the addressed ROM bit cell 205 is programmed then it pulls down its bitline 225. Similarly, the addressed wordline 215 drives the addressed reference cell 265 to pull down its reference bitline 260. As stated above, each reference cell 265 includes n-channel transistors 270 and 275 connected in series. Since the impedance through a programmed ROM bit cell 205 is less than the impedance through the series-connected reference cell 265, an addressed ROM bit cell 205 pulls current down from its bitline 225 to its grounded source about twice as fast as an addressed reference cell 265 pulls current down from its reference bitline 260 to the grounded source of its n-channel transistor 275. Thus, sense amplifier 330 can sense the signal on a bitline 225 and the signal on a reference bitline 260 to determine a differential information and then output a corresponding signal via line 345.

If a ROM bit cell 205 is not programmed, then when addressed it does not pull down its bitline 225. However, the addressed wordline 215 drives the addressed reference cell 265 to pull down its reference bitline 260. Thus, a differential information (opposite to the differential information for a programmed cell 205) results between the addressed bitline 225 signal and the reference bitline 260 signal.

Sense amplifier 330 senses the differential information between a bitline 225 and reference bitline 260 to determine whether the data bit stored in the addressed ROM bit cell 205 is a logic 1 or a logic 0. Sense amplifier 330 converts this differential information into a data signal having a form and range compatible to subsequent digital circuit 347 connected to output line 345 For example, sense amplifier 330 may generate a data signal at output line 345 where 0 volts corresponds to a logic 0 and +3.0 volts corresponds to a logic 1.

FIG. 3 shows a preferred embodiment of the generic sense amplifier 330 of FIG. 2. Sense amplifier 330 incorporates a latch-type double-ended sensing scheme and includes cross-coupled inverters 500 and 505. Inverter 500 includes p-channel transistor 510 and n-channel transistor 515. P-channel transistor 510 has a source connected to Vcc, while n-channel transistor 515 has a source connected to node 517. The drains of p-channel transistor 510 and of n-channel transistor 515 are connected together and to line 335, while the gates of p-channel transistor 510 and of n-channel transistor 515 are connected together and to line 340.

Inverter 505 includes p-channel transistor 520 and n-channel transistor 525. P-channel transistor 520 has a source connected to Vcc, while n-channel transistor 525 has a source connected to node 517. The drains of p-channel transistor 520 and of n-channel transistor 525 are connected together to line 340 and to an input terminal of a NOR gate 545, while the gates of p-channel transistor 520 and of n-channel transistor 525 are connected together, to line 335 and to an input terminal of a NOR gate 550.

Because inverters 500 and 505 are cross-coupled, they are latched and stable. Inverters 500 and 505 may be designed to have a high common-mode rejection ratio (CMMR), which is the ratio of the response for a normal-mode signal to the response for a common-mode signal of the same amplitude. A high CMMR permits rejection of picked-up interference due to cross-talk from other parts of a system (not shown) incorporating the invention. Sense amplifiers which include cross-coupled inverter pair circuits are also disclosed in U.S. Pat. Nos. 5,561,629 and 5,563,527, which are fully incorporated herein by reference.

In FIG. 3, reference input line 340 is provided with a load (NOR gate 545 and n-channel transistor 535) which is comparable to the input line 335 load (NOR gate 550 and n-channel transistor 540). The output terminal of NOR gate 545 is connected to n-channel transistor 535, while the output terminal of a NOR gate 550 is connected to n-channel transistor 540. NOR gate 545 also have additional input terminals connected to Vcc. N-channel transistor 535 has its drain and its source both connected to Vss, while n-channel transistor 540 has its drain connected to output line 345 and its source connected to Vss.

Sense amplifier 330 includes a NAND gate 555 which has an output terminal connected to the sources of n-channel transistors 515 and 525. NAND gate 555 has a first input terminal connected to input node 560 and a second input terminal connected to input node 565. An inverter 570 has an input terminal connected to input node 560, while an inverter 575 has an input terminal connected to input node 565. The output terminals of inverters 570 and 575 are connected to input terminals of NOR gate 550.

Commonly assigned patent application entitled "DIGITAL CIRCUIT FOR CONSERVING STATIC CURRENT IN AN ELECTRONIC DEVICE," supra, discloses circuitry (not shown in FIG. 4) for driving input signals to input nodes 560 and 565. After a sufficient differential builds up between input line 335 and reference input line 340, the input signals at input node 560 and at input node 565 will go high. The NAND gate 555 output signal will then go low, thereby pulling the source voltages of n-channel transistors 515 and 525 to a low level. Thus, if a selected cell 205 is programmed, the output of NOR gate 550 will be high, thereby turning on n-channel transistor 540. Pre-charged internal data bus 347 will then discharge via output line 345 and n-channel transistor 540. However, if the sensed cell 205 is not programmed, then the output of NOR gate 550 will be low. The output line 345 voltage will remain high since pre-charged internal data bus 347 will not discharge via n-channel transistor 540.

FIG. 4 is a flowchart illustrating steps in a method of operation according to the invention. In step 600, sense amplifier 330 senses the signal of a bitline 225 connected to an addressed ROM bit cell 205. Sense amplifier 330 also senses the signal of a reference bitline 260 corresponding to the sensed bitline 225.

In step 605, sense amplifier 330 senses a differential information between the sensed bitline 225 signal and its corresponding reference bitline 260 signal. If a ROM bit cell 205 is programmed, then ROM bit cell 205 pulls current down from its bitline 225 to its grounded source at rate which is about twice the rate at which reference cell 265 pulls current down from its reference bitline 260 to the grounded source of its n-channel transistor 275. Thus, a differential information results between the sensed bitline 225 signal and the reference bitline 260 signal. If ROM bit cell 205 is not programmed, then ROM bit cell 205 does not pull down its bitline 225. However, wordline 215 drives reference cell 265 to pull down its reference bitline 260. Thus, a differential information (opposite to the differential information of a programmed cell 205) results between the sensed bitline 225 signal and the reference bitline 260 signal.

Thus, if the sensed cell 205 is programmed, the input line 335 signal will be lower than the line 340 signal and the line 345 output signal will low. If the sensed cell 205 is not programmed, the input line signal 335 will be higher than the line 340 signal and the line 345 output signal will be high or equal to Vcc.

In step 610, sense amplifier 330 outputs a signal responsive to the differential information sensed (in step 610) between bitline 225 and reference bitline 260. The sense amplifier 330 output signal may be driven into a subsequent digital circuit 347.

While various embodiments and applications of this invention have been shown and described, it will be apparent to those skilled in the art that modifications are possible without departing from the inventive concepts described herein. For example, ROM bit cell 205 may include one of the following ROM-family memory cells: mask ROM cells, ultraviolet erasable electrically programmable ROMs (UV-EPROMs), electrically erasable electrically programmable ROMs (EEPROMs), electrically alterable ROM (EAROMs), onetime-programmable EPROM (OTP-EPROMs), and various modern variations such as the NV-SRAMs and NV-DRAMs. The invention, therefore, is not to be restricted except in the spirit of the appended claims.

What is claimed is:

1. A read-only memory comprising:
    a plurality of memory cells arranged in x rows and y columns in an array wherein each of said memory cells comprises an n-channel transistor having a drain connected to one of said bitlines, having a source connected to a second voltage potential and having a gate connected to one of said wordlines;
    x wordlines in respective rows each connected to y memory cells;
    m reference bitlines each corresponding to n bitlines where (m×n)=y, each of said reference bitlines having x reference cells each connected to a respective wordline, wherein each of said reference cells comprises a pair of reference transistors including a first reference n-channel transistor having a drain connected to one of said reference bitlines, having a gate connected to one of said wordlines and having a source and including a second reference n-channel transistor having a drain connected to said source of said first reference n-channel transistor, having a source connected to a second voltage potential and having a gate connected to said gate of said first reference n-channel transistor; and
    m sense amplifiers each having a first input terminal connected to a respective n bitlines and having a second input terminal connected to a respective one of said reference bitlines, and each being responsive to a difference between a signal on one of said reference bitlines.

2. The read only memory of claim 1 further comprising:
    a bitline select circuit connected to said bitlines and to at least one of said sense amplifiers, for selectively connecting said bitlines to at least one of said sense amplifiers.

3. The read only memory of claim 2 wherein said bitline select circuit comprises a column decoder.

4. The read only memory of claim 1 further comprising:
    a dummy reference bitline select circuit connected to said reference bitline and to at least one of said sense amplifiers.

5. The read only memory of claim 1 further comprising:
    a plurality of switches each having a control terminal connected to a pre-charging circuit, having a first current terminal connected to a first voltage potential and having a second current terminal connected to one of said bitlines.

6. The read only memory of claim 5 wherein each of said switches comprises:
    a p-channel transistor having a gate connected to said pre-charging circuit, having a source connected to said first voltage potential and having a drain connected to one of said bitlines.

7. The read only memory of claim 1 wherein each of said sense amplifiers comprises:

a first inverter having an input terminal connected to one of said reference bit lines for sensing one of said reference bitlines and having an output terminal;

a second inverter having an input terminal connected to the respective n bitlines and connected to said output terminal of said first inverter for sensing said bitlines and having an output terminal connected to the input terminal of the first inverter and connected to one of said reference bit lines;

a first NOR gate having an input terminal connected to said output terminal of said second inverter and having an output terminal;

a second NOR gate having an input terminal connected to said output terminal of said first inverter and having an output terminal;

a first load switch having a control terminal connected to said output terminal of said first NOR gate and having a pair of current terminals connected to a second voltage potential; and a second load switch having a control terminal connected to said output terminal of said second NOR gate, having a first current terminal connected to an output line and having a second current terminal connected to said second voltage potential.

8. The read only memory of claim 7 wherein said first load switch comprises:

a first load n-channel transistor having a gate connected to said output terminal of said first NOR gate and having a drain and a source both connected to said second voltage potential.

9. The read only memory of claim 7 wherein said second load switch comprises:

a second load n-channel transistor having a gate connected to said second NOR gate, having a drain connected to said output line and having a source connected to said second voltage potential.

10. The read only memory of claim 7 wherein each of said sense amplifiers provides that:

said first inverter includes a first current terminal connected to a first voltage potential; and said second inverter includes a first current terminal connected to said first voltage potential.

11. The read only memory of claim 10 wherein each of said sense amplifiers further comprises:

a first control input node for receiving a first control input signal;

a second control input node for receiving a second control input signal;

a NAND gate having a first input terminal connected to said first control input node, having a second input terminal connected to said second control input node and having an output terminal connected to a second current terminal of said first inverter and connected to a second current terminal of said second inverter to thereby provide connections for the second current terminals of the first and the second inverters to the second voltage potential;

a third inverter having an input terminal connected to said first input node and having an output terminal connected to an input terminal of said second NOR gate; and a fourth inverter having an input terminal connected to said second input node and having an output terminal connected to an input terminal of said second NOR gate, said second NOR gate responsive to said first input signal, to said second input signal and to a signal from said output terminal of said first inverter by switching on and off said second load switch.

12. The read only memory of claim 1 wherein a reference bitline corresponds to 32 bitlines.

13. A read only memory comprising:

a plurality of memory cells, wherein each of said memory cells comprises an n-channel transistor having a drain connected to one of said bitlines, having a source connected to a second voltage potential and having a gate connected to one of said wordlines;

x wordlines each associated with y memory cells;

y bitlines each associated with x memory cells;

m reference bitlines each associated with a fixed number of said bitlines, each of said reference bitlines associated with x reference cells each connected to one of said wordlines wherein each of said reference cells comprises a pair of reference transistors including a first reference n-channel transistor having a drain connected to one of said reference bitlines, having a gate connected to one of said wordlines, and having a source, and wherein each of said reference cells also includes a second reference n-channel transistor having a drain connected to said source of said first reference n-channel transistor, having a source connected to a second voltage potential, and having a gate connected to said gate of said first reference n-channel transistor;

a decoder connected to said y bitlines;

a dummy reference decoder connected to said m reference bitlines; and m sensing circuits connected to said decoder and to said dummy reference decoder, and configured to sense the signals on said bitlines and the signals on said reference bitlines, wherein each of said sensing circuits comprises:

a first inverter having an input terminal for sensing one of said reference bitlines and an output terminal;

a second inverter having an input terminal connected to said output terminal of said first inverter for sensing said bitlines and having an output terminal;

a first NOR gate having an input terminal connected to said output terminal of said second inverter and having an output terminal;

a second NOR gate having an input terminal connected to said output terminal of said first inverter and having an output terminal;

a first load switch having a control terminal connected to said output terminal of said first NOR gate and having current terminals connected to a second voltage potential; and a second load switch having a control terminal connected to said output terminal of said second NOR gate, having a first current terminal connected to an output line and having a second current terminal connected to said second voltage potential.

14. The read only memory of claim 13 further comprising:

a plurality of switches each having a control terminal connected to a pre-charging circuit, having a first current terminal connected to a first voltage potential and having a second current terminal connected to one of said bitlines.

15. The read only memory of claim 14 wherein each of said switches comprises:

a p-channel transistor having a gate connected to said pre-charging circuit, having a source connected to said first voltage potential and having a drain connected to one of said bitlines.

16. The read only memory of claim 13 wherein said first load switch comprises:
a first load n-channel transistor having a gate connected to said output terminal of said first NOR gate and having a drain and a source both connected to said second voltage potential.

17. The read only memory of claim 13 wherein said second load switch comprises:
a second load n-channel transistor having a gate connected to said second NOR gate, having a drain connected to said output line and having a source connected to said second voltage potential.

18. The read only memory of claim 13 wherein:
said first inverter includes a first current terminal connected to a first voltage potential; and
said second inverter includes a first current terminal connected to said first voltage potential.

19. The read only memory of claim 13 further comprising:
a first input node for receiving a first input signal;
a second input node for receiving a second input signal;
a NAND gate having a first input terminal connected to said first input node, having a second input terminal connected to said second input node and having an output terminal connected to a second current terminal of said first inverter and connected to a second current terminal of said second inverter to thereby connect the second current terminal of the first and second inverter to the second voltage potential;
a third inverter having an input terminal connected to said first input node and having an output terminal connected to an input terminal of said second NOR gate; and
a fourth inverter having an input terminal connected to said second input node and having an output terminal connected to an input terminal of said second NOR gate, said second NOR gate responsive to said first input signal, to said second input signal and to a signal from said output terminal of said first inverter by switching on and off said second load switch.

20. The read only memory of claim 13 wherein a reference bitline is associated with 32 bitlines.

* * * * *